(12) United States Patent
Hobbs et al.

(10) Patent No.: US 8,269,514 B2
(45) Date of Patent: Sep. 18, 2012

(54) METHOD AND APPARATUS FOR MULTILAYER SUPPORT SUBSTRATE

(75) Inventors: Eric D. Hobbs, Livermore, CA (US); Gaetan L. Mathieu, Varennes (CA); Frank M. Zalar, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 398 days.

(21) Appl. No.: 12/547,454

(22) Filed: Aug. 25, 2009

(65) Prior Publication Data

US 2011/0050265 A1     Mar. 3, 2011

(51) Int. Cl.
*G01R 31/20* (2006.01)
(52) U.S. Cl. .......... 324/754.07; 324/754.03; 324/754.11
(58) Field of Classification Search ............ 324/754
See application file for complete search history.

(56) References Cited

U.S. PATENT DOCUMENTS

| | | | |
|---|---|---|---|
| 5,874,776 A | 2/1999 | Kresge et al. | |
| 6,765,400 B2 | 7/2004 | Ido | |
| 6,972,578 B2 | 12/2005 | Martens et al. | |
| 7,285,968 B2 | 10/2007 | Eldridge et al. | |
| 7,772,858 B2 | 8/2010 | Sasaki et al. | |
| 2008/0042668 A1* | 2/2008 | Eldridge et al. | 324/754 |
| 2008/0150565 A1* | 6/2008 | Nayak et al. | 324/758 |
| 2008/0211525 A1 | 9/2008 | Garabedian et al. | |
| 2010/0000080 A1* | 1/2010 | Eldridge et al. | 29/729 |
| 2010/0156449 A1 | 6/2010 | Nitta et al. | |
| 2010/0327891 A1* | 12/2010 | Hobbs | 324/750.03 |

* cited by examiner

*Primary Examiner* — Thomas Valone
(74) *Attorney, Agent, or Firm* — Kirton McConkie

(57) ABSTRACT

Embodiments of the present invention can relate to probe card assemblies, multilayer support substrates for use therein, and methods of designing multilayer support substrates for use in probe card assemblies. In some embodiments, a probe card assembly may include a multilayer support substrate engineered to substantially match thermal expansion of a reference material over a desired temperature range; and a probe substrate coupled to the multilayer support substrate. In some embodiments, the reference material may be silicon.

21 Claims, 3 Drawing Sheets

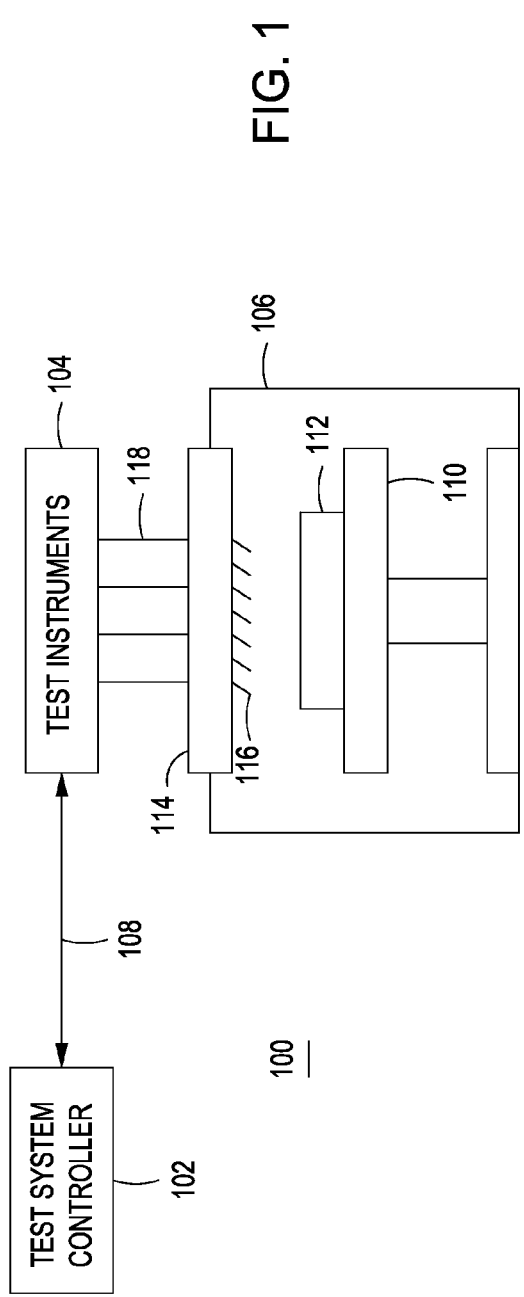
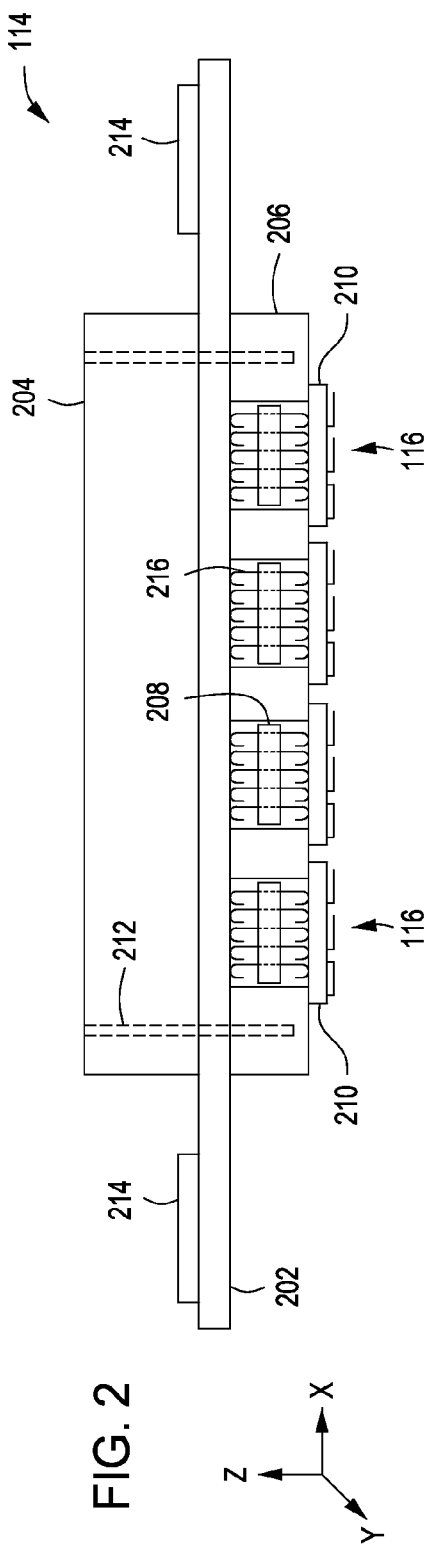

METHOD AND APPARATUS FOR MULTILAYER SUPPORT SUBSTRATE

BACKGROUND

1. Field

Embodiments of the present invention generally relate to semiconductor testing.

2. Description of the Related Art

A device under test (DUT), for example, a semiconductor device, printed circuit board, or the like, is often tested at multiple operating temperatures. The materials of the device, for example, silicon, metals, dielectric materials, and the like can expand or contract as a function of the operating temperature. Unfortunately, a probe card utilized to test the DUT may not expand or contract at the same rate as the DUT. As such, when testing at two or more temperatures, the probe card typically provides less than ideal alignment between probes of the probe card and terminals of the DUT at any of the testing temperatures.

SUMMARY

Embodiments of the present invention can relate to probe card assemblies, multilayer support substrates for use therein, and methods of designing multilayer support substrates for use in probe card assemblies. In some embodiments, a probe card assembly may include a multilayer support substrate engineered to substantially match thermal expansion of a reference material over a desired temperature range; and a probe substrate coupled to the multilayer support substrate. In some embodiments, the reference material may be silicon.

In some embodiments, a probe card may include a wiring substrate having a first side and an opposing second side; a stiffener disposed on the first of the wiring substrate; a multilayer support substrate disposed on the second side of the wiring substrate, the multilayer support substrate engineered to substantially match thermal expansion of a reference material over a desired temperature range; a plurality of probe substrates coupled to the multilayer support substrate on a side opposing the wiring substrate; and a plurality of probes extending from each probe substrate generally away from the wiring substrate, each probe being electrically connected to the wiring substrate and configured to contact terminals of a device to be tested.

In some embodiments, a method of designing the multilayer support substrate for use in the probe card can include selecting a first material having a first coefficient of thermal expansion (CTE) over a desired temperature range that is greater than or less than a CTE of a reference material over the desired temperature range; selecting a second material having a second CTE over the desired temperature range that is complementary to the CTE of the first material with respect to the CTE of the reference material over the desired temperature range; and forming a multilayer support substrate having two outer layers formed from one of the first or the second material and an inner layer formed from the other of the first or the second material such that the multilayer support substrate has an aggregate thermal expansion behavior over the desired temperature range that substantially matches that of the reference material.

In some embodiments, the reference material is silicon and the desired temperature range can be between about −50 to about 150 degrees Celsius in the method and probe card described above.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 1 depicts a test system having a probe card assembly according to some embodiments of the invention.

FIG. 2 depicts a probe card assembly according to some embodiments of the invention.

Where possible, identical reference numerals are used herein to designate identical elements that are common to the figures. The images used in the drawings are simplified for illustrative purposes and are not necessarily depicted to scale.

DETAILED DESCRIPTION

Figure 3:
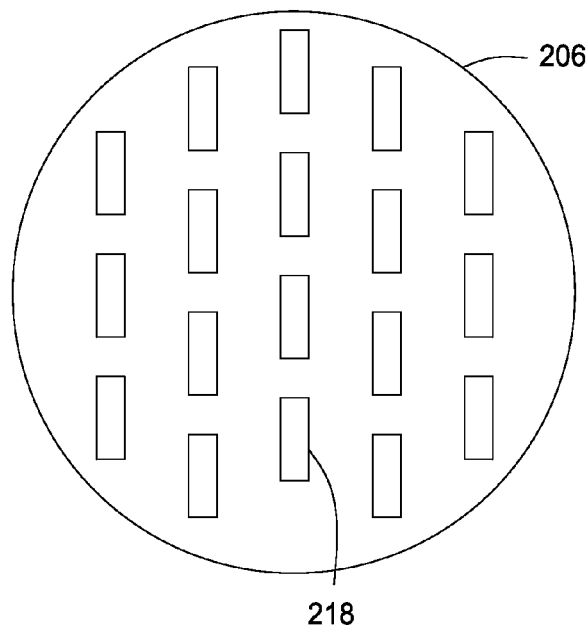
FIG. 3 depicts a top view of a multilayer support structure according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of items (e.g., items a, b, c), such reference is intended to include any one of the listed items by itself, any combination of less than all of the listed items, and/or a combination of all of the listed items.

Embodiments of the present invention can relate to probe card assemblies, multilayer support substrates for use therein, and methods of designing multilayer support substrates for use in probe card assemblies. The inventive multilayer support substrate may be utilized in a probe card assembly for advantageously testing a device, for example, a printed circuit board or other such large scale device, at multiple temperatures (e.g., over a desired temperature range). The inventive probe card may advantageously be designed using the methods disclosed herein such that the multilayer support substrate and the device have substantially matching thermal expansion over the desired temperature range within a desired tolerance as desired for a particular application (for example, within ±1 micron, within ±2 microns, or within ±10 microns, or the like). In some embodiments, this matching of thermal expansion takes into account an expected difference in temperature of the device and the multilayer support substrate. For example, it can desirable to have the thermal expansion of the multilayer support substrate substantially match the thermal expansion of the device knowing that the device will be at one temperature and the multilayer support substrate at a slightly different temperature due to thermal differences between the device and the multilayer substrate for a given test temperature.

FIG. 1 depicts a test system 100 utilizing a probe card assembly 114 having a multilayer support substrate in accordance with some embodiments of the invention. The test system 100 can generally include a test system controller 102, test instruments 104, the probe card assembly 114, and a prober 106. The test system controller 102 may comprise, for example, a host computer (e.g., a general purpose computer), and can be coupled to the test instruments 104 by a communication link 108. Test data can be generated by the test instruments 104 and transmitted through the probe card assembly 114 to the DUT 112 via one or more connectors 118. The connectors 118 may be any suitable connectors, such as flexible cable connectors, pogo pins, zero insertion force (ZIF) connectors, or the like. Test results can then be provided from the DUT 112 back through the probe card assembly 114 to the test instruments 104. The test instruments 104 may transmit the test results to the test system controller 102 for analysis. Overall control of the test instruments 104 for testing may be orchestrated by the test system controller 102.

The prober 106 can include a stage 110 for mounting a device under test (DUT) 112 being tested. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices. The probe card assembly 114 can include resilient contact elements 116 (also referred to as probes, or test probes) that contact test features (e.g., input/output terminals) of the DUT 112. The stage 110 can be movable to contact the DUT 112 with resilient contact elements 116.

The probe card assembly 114 can act as an interface between the test instruments 104 and the DUT 112. The probe card assembly 114 can typically be a demountable assembly for use with various testers and probers. In some embodiments, the probe card assembly 114 can be specific to each type of DUT being tested. The probe card assembly 114 can include electrical connectors 118 configured to make electrical connections with the test instruments 104. The electrical connectors 118 are more fully described below. As noted above, the probe card assembly 114 can also include one or more resilient contact elements 116 as test probes. The resilient contact elements 116 can be configured to be pressed against, and thus make temporary electrical pressure connections with, one or more input and/or output terminals (not shown) of the DUT 112. The resilient contact elements 116 are typically configured to correspond to desired terminals of the DUT 112 and may be arranged in one or more arrays having a desired geometry.

FIG. 2 depicts the probe card assembly 114 according to some embodiments of the invention. The probe card assembly 114 can include a wiring substrate 202, a stiffener 204, a multilayer support substrate 206, interposer substrates 208, and one or more probe substrates 210 having one or more resilient contact elements 116 extending therefrom. The stiffener 204 can be coupled to the multilayer support substrate 206 via fasteners 212 that extend through the wiring substrate 202. In some embodiments these fasteners can be generally rigid in "z" direction and flexible in "x" and/or "y" direction (as such directions are labeled in the Figure). The wiring substrate 202 can be configured to float between the stiffener 204 and the multilayer support substrate 206. For example, the wiring substrate 202 may be disposed between the multilayer support substrate 206 and the stiffener 204 such that the wiring substrate 202 is constrained, by the stiffener 204 and the multilayer support substrate 206, from movement in a direction normal to surfaces of the wiring substrate facing the stiffener 204 and the multilayer support substrate 206 (e.g., in the z direction as illustrated), and wherein the wiring substrate 202 may move in a direction parallel to surfaces of the wiring substrate 202 facing the stiffener 204 and the multilayer support substrate 206 (e.g., in the x-y plane as illustrated). In some embodiments, at least the center of the wiring substrate is fixed relative to the center of the stiffener 204 such that the stiffener 204 and the wiring substrate 202 may expand and/or contract radially relative to each about their center points. The wiring substrate 202 can support electrical connectors 214 configured to make electrical connections with the test instruments 104. Electrical connectors can be any suitable connectors, such as flexible cable connectors, pogo pins, zero insertion force (ZIF) connectors, or the like The multilayer support substrate 206 can be a composite structure having a targeted, engineered coefficient of thermal expansion such that it has an aggregate thermal expansion behavior that substantially matches that of a reference material at the same, or a different, temperature, as discussed in more detail below. As used herein, the term coefficient of thermal expansion, or CTE, can include a CTE at a singular temperature or an average CTE over a range of desired temperatures. The probe substrates 210 can be mounted to the multilayer support substrate 206 such that their position may be controlled via the expansion and/or contraction of the multilayer support substrate 206 over a particular temperature range. For example, the probe substrates 210 can be attached via support members generally rigid in "z" direction and flexible in "x" and/or "y" direction. In another example, the probe substrates 210 can be attached using solder balls and/or adhesives. The multilayer support substrate 206 can include one or more openings 218, corresponding to respective positions of probe substrates 210, in which interposer substrates 208 are respectively disposed. The interposer substrates 208 can electrically couple the wiring substrate 202 to the probe substrates 210. For example, each of the interposer substrates 208 may include electrically conductive spring interconnect structures 216 disposed therethrough that electrically couple the substrate 202 to respective probe substrates 210. The stiffener 204 and/or the multilayer support substrate 206 can provide stiffness in a "z" direction. The fasteners 212 can provide stiffness in a "z" direction, while being compliant in an "x" and/or "y" direction.

Electrically conductive paths are typically provided from the connectors 214 through the various substrates to the resilient contact elements 116. For example, in the embodiment depicted in FIG. 2, electrically conductive paths may be provided from the connectors 214 through the wiring substrate 202 to the electrically conductive spring interconnect structures 216. Other electrically conductive paths may be provided from the spring interconnect structures 216 through the probe substrates 210 to the resilient contact elements 116. The electrically conductive paths through the wiring substrate 202, the interposer substrates 208, and the probe substrates 210 can comprise electrically conductive vias, traces, or the like, that may be disposed on, within, and/or through the wiring substrate 202 and the probe substrates 210. The wiring substrate 202, the interposer substrates 208, and the probe substrates 210 can generally be made of any type of suitable material or materials, such as, without limitation, printed circuit boards, ceramics, metals, metal alloys, organic or inorganic materials, and the like, or combinations thereof. In some embodiments, the wiring substrate may be rigid, or substantially rigid.

Figure 4A:
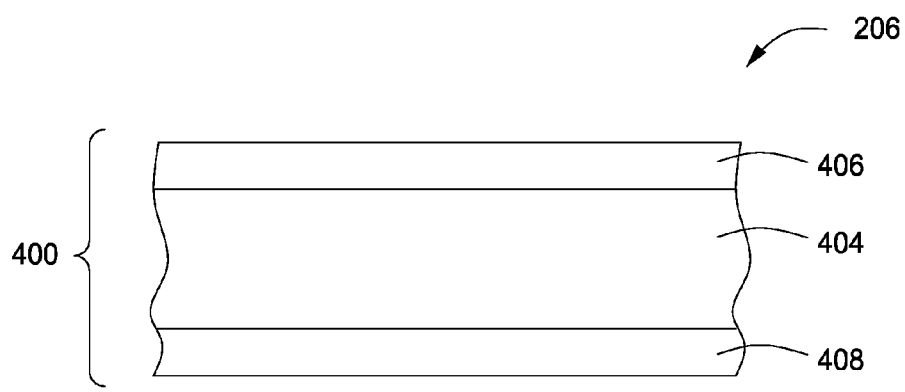
FIGS. 4A-B respectively depict partial side views of multilayer support structures according to some embodiments of the invention.
Figure 4B:
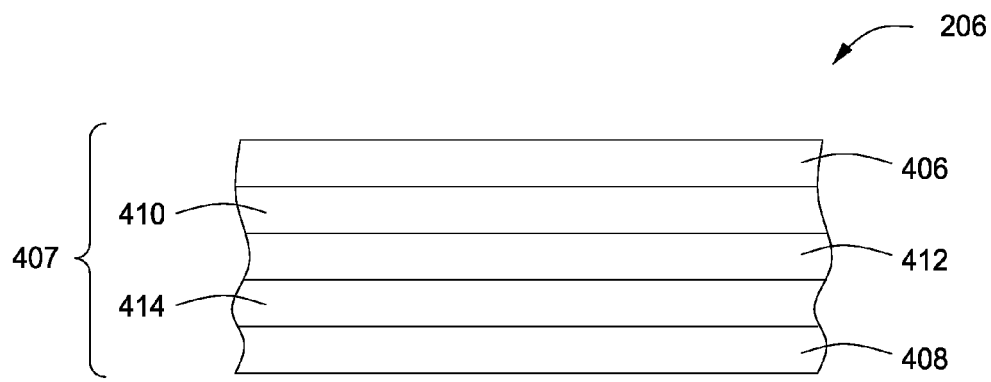

The multilayer support substrate 206 is depicted in further detail in FIGS. 3 and 4A-B. FIG. 3 depicts an exemplary top view of the multilayer substrate support 206 in accordance with some embodiments of the present invention. The multilayer support substrate 206 can be disk-like, having a generally circular geometry as viewed from the top, and as illustrated in FIG. 3. However, the configuration is not limited to a circular geometry, and the multilayer support substrate 206 may have any suitable geometry desired for a particular application. The one or more openings 218 disposed through the multilayer support substrate 206 may be arranged in any suitable configuration corresponding to positions of the probe substrates 210 desired for contacting the DUT 112 with the resilient contact elements 116. In addition, each opening 218 may have the same or different dimensions than others of the openings 218.

FIGS. 4A-B depict partial cross sectional views of the layers of the multilayer support substrate 206 in accordance with some embodiments of the present invention. The multilayer support substrate 206 may be designed to have a thermal expansion that approximately, or substantially, matches the thermal expansion of a desired reference material over a desired temperature range. The reference material and multilayer support substrate 206 may or may not have the same temperature within the desired range. As the thermal expansion, or thermal strain, of a component is equal to the coefficient of thermal expansion (CTE) of the component times the change in temperature of the component, the thermal expansion of two different components may be matched even if the respective changes in temperature of the components are different (by controlling the respective coefficients of thermal expansion of the components). Accordingly, in some embodiments, the thermal expansion of the multilayer support substrate 206 may be offset from the thermal expansion of the reference material over the desired temperature range such that the expansion of the multilayer support substrate 206 substantially tracks the expansion of the reference material over the desired temperature range when the multilayer support substrate 206 and the reference material are at different temperatures. For example, by appropriately designing the multilayer support substrate 206 such that it approximately matches the thermal expansion of a DUT (e.g., silicon) to be tested over a desired temperature range, probe elements disposed on probe substrates coupled to the multilayer support substrate 206 may remain well aligned with corresponding elements of the DUT being tested over the desired temperature range. As another example, in embodiments where the DUT and the multilayer support substrate 206 are at different temperatures during testing (for example due to a thermal gradient between the DUT and the multilayer support substrate 206), the thermal expansion of the multilayer support substrate 206 may be designed to be offset from the thermal expansion of the DUT to account for the thermal gradient, such that probe elements disposed on probe substrates coupled to the multilayer support substrate 206 may remain well aligned with corresponding elements of the DUT being tested over the desired temperature range. In some embodiments, the desired temperature range may be between about −50 to about 150 degrees Celsius. In some embodiments, the overall CTE of the multilayer support substrate 206 is about the same as silicon.

The multilayer support substrate 206 generally includes at least three layers—two outer layers and at least one inner layer. At least some of the layers have coefficients of thermal expansion that are different with respect to each other. The layers may be arranged with respect to their coefficients of thermal expansion such that the multilayer support substrate 206 remains substantially flat over a range of desired temperatures. In some embodiments, the layers may be arranged symmetrically or asymmetrically with respect to thickness, CTE, or both. For example, the layers of the multilayer support substrate 206 may be configured to provide a desired average CTE over a range of temperatures where a substantially uniform temperature is expected to be present in the multilayer support substrate 206, or where a temperature gradient is expected to develop in the multilayer support substrate 206. Although discussed above as having at least three layers, the multilayer support substrate 206 could have two layers with different coefficients of thermal expansion. In such embodiments, the multilayer support substrate 206 would tend to bow as the different layers expand or contract at different rates. Accordingly, a multilayer support substrate 206 having two layers would require compensation for the bow. For example, the design could include constraining mechanisms to limit the bow, such as clamps, pins, fasteners, or the like. Alternatively or in combination, a two-layer composite may be fabricated by appropriately modifying the modulus of one of the two layers (such as the layer having the higher expansion) in order to control the CTE of the composite to match, or more closely match, a desired CTE. Possible modulus modification methods may include machining, foaming, or light metal particle sintering.

In some embodiments, the composition of each layer and/or the combination of layers may be selected to have coefficients of thermal expansion that bound the CTE of a desired reference material and that are arranged to form a multilayer composite having a thermal expansion that substantially matches that of the reference material over a desired temperature range. The reference material may be a material of the DUT 112, such as silicon, other suitable DUT materials, or other materials for which matching thermal expansion is desired.

As depicted in Formula (1), below, a composite coefficient of thermal expansion can be determined (and/or targeted), via the selection of materials for each layer and the fractional thickness of each layer. In the below formula, for each layer, i or j, E is Young's modulus, $\alpha(T)$ is the average CTE from 20 degrees Celsius to a temperature T, and $\tau$ is the fractional thickness of the layer:

$$\overline{\alpha}(T)_{Composite} \cong \frac{\sum_i E_i \overline{\alpha}_i(T) \tau_i}{\sum_j E_j \tau_j} \qquad \text{Formula (1)}$$

In some embodiments, in addition to controlling the average CTE of the multilayer support structure 206, the selection of materials (and/or the thickness of particular layers of such materials) may also be utilized to control other parameters, such as one or more of machinability, cost, weight, stiffness, thermal conductivity, or the like. Such considerations may facilitate the implementation of the multilayer support structure 206 in a probe card assembly as described herein. Non-limiting examples of suitable materials to form the various layers of the multilayer support structure 206 include copper, iron-nickel alloys (for example, having between about 32 to about 42 atomic percent nickel content), aluminum, foamed materials (such as metals, for example, aluminum foam, or ceramics), or the like.

In some embodiments, use of a foamed material to fabricate one or more layers of the multilayer support substrate 206 can provide additional control over the CTE of the particular layer by controlling the density of the material. For example, the modulus of elasticity (e.g., Young's modulus) for a material may be controlled as shown in Formula (2), below, where E is Young's modulus and ρ is density. Such modulus shift control facilitates the use of a wider selection of materials as foams for layers of the multilayer support substrate, such as metals and ceramics.

$$E_{foam} \cong E_{base}\left(\frac{\rho_{foam}}{\rho_{base}}\right)^2 \qquad \text{Formula (2)}$$

In addition, use of a foamed material for one or more layers of the multilayer support structure 206 may facilitate reduction in weight (e.g., mass) of the multilayer support structure 206 (as compared to similar structures fabricated from solid, non-foamed, materials) which can lead to shorter times to achieve a desired temperature or thermal profile (e.g., steady-state or near steady-state) suitable for testing to begin, as the time to reach such steady-state or near steady-state thermal profiles is generally proportional to mass. In some embodiments, a multilayer support substrate may have improved thermal conductivity as compared to monolithic low expansion alloys, such as a thermal conductivity of greater than about 10 Watts/meter-Kelvin. Also, use of a foamed metal for one or more layers of the multilayer support structure 206 may facilitate improved thermal conductivity and/or thermal diffusivity as compared to monolithic low expansion alloys (such as iron-nickel alloys), which may also lead to a reduction time to reach a desired thermal profile, as discussed above.

For example, a multilayer composite 400 that may form the multilayer support structure 206 in accordance with some embodiments of the present invention is depicted in a partial side view in FIG. 4A. The multilayer composite 400 may include an inner layer 404 sandwiched between outer layers 406, 408. The outer layers 406, 408 can be formed of a first material having a first CTE over a desired temperature range and the inner layer 404 can be formed of a second material having a second CTE, different than the first, over the desired temperature range. In some embodiments the outer layers 406 and 408 can be different materials. In some embodiments, over the desired temperature range, one of the first material or the second material can have a CTE that is greater than the CTE of a reference material and the other of the first material or the second material can have a CTE that is less than the CTE of the reference material. The first and second CTE's can be selected such that the aggregate CTE of the multilayer composite 400 is a desired value (or is a desired function of temperature). Put another way, the first and second CTE's can be selected such that the thermal expansion of the multilayer composite 400 substantially matches the thermal strain of the DUT 112. The first and second CTE's can be further selected such that the aggregate thermal strain of the multilayer composite 400 substantially matches, or tracks, the thermal strain of the DUT 112 when the DUT 112 is at a different temperature than the multilayer composite 400 as discussed above (e.g., when a temperature gradient exists between the DUT 112 and the multilayer composite 400, defining an offset in the respective temperatures). Further, the overall CTE of the multilayer composite 400 can be controlled by changing the thickness of any one or more of the composite layers, the identity of the materials used for any of the composite layers, or the like.

The following examples of material configurations are provided for illustrative purposes only and are not intended to be limiting of the scope of the invention, as any of the materials or layer combinations disclosed herein may be utilized for the multilayer support layer. In some embodiments, provided for illustrative purposes only, the outer layers 406, 408 may be fabricated from an iron-nickel alloy, such as INVAR. In some embodiments, the inner layer 404 may be fabricated from copper. In some embodiments, the inner layer 404 may be fabricated from aluminum foam. In some embodiments, the outer layers 406, 408 may be fabricated from an iron-nickel alloy and the inner layer 404 may be fabricated from copper. In some embodiments, the outer layers 406, 408 may be fabricated from an iron-nickel alloy and the inner layer 404 may be fabricated from aluminum foam. In some embodiments, the outer layer 406 can be INVAR, the inner layer copper and the outer layer 408 can be alloy 42, an nickel-iron controlled-expansion alloy containing 42% nickel, where outer layer 406 is closer to the DUT than the outer layer 408.

In one non-limiting example, each layer 406, 408 may be about 2 mm thick, although other thicknesses may be utilized. The inner layer 404 may be fabricated from an aluminum foam. The inner layer may be about 4.5 mm thick, although other thicknesses may be utilized. Thus, the overall thickness of the multilayer support substrate 206 may be about 8.5 mm. It is specifically contemplated that other thicknesses of individual layers and/or of the multilayer support substrate may be utilized as desired for particular applications. For example, space limitations may define the allowable thickness of the multilayer support substrate, or other design considerations, such as stiffness, thermal conductivity, material selection, or the like may affect the thickness of individual layers and the multilayer support substrate required to obtain the desired thermal expansion of the multilayer support substrate.

Another exemplary embodiment of a multilayer composite 407 suitable for use in the multilayer support substrate 206 is depicted in FIG. 4B. The multilayer composite 407 includes a plurality of inner layers sandwiched between the outer layers 406, 408. The plurality of inner layers may generally include any number of inner layers, for example, three layers 410, 412, and 414 as depicted in FIG. 4B. The plurality of inner layers can be configured to distribute the thermal stresses of the multilayer composite 407 over the greater plurality of layers (as compared to the three-layer multilayer support substrate depicted in FIG. 4A). Thus, thermal stress can be reduced at the interface of adjacent layers in the multilayer composite 407 over the temperature range used to test the DUT 112. The plurality of inner layers need not be limited to three layers as shown, and any suitable number of layers which minimizes thermal stress while providing a desired thermal expansion as a function of temperature that reduces, or minimizes, thermal strain mismatch between the support substrate 206 and the DUT 112. Similar to the multilayer composite 400, the CTE of the multilayer composite 407 can be adjusted by changing the relative thickness of one or more of the composite layers and/or the identity of the materials used for any of the composite layers.

The layers of the multilayer composite 407 may be selected and/or arranged similar to as described above with respect to the multilayer composite 400. In some embodiments, the central inner layer (e.g., 412) may be fabricated from the same material as the outer layers 406, 408. Alternatively, the central inner layer (e.g., 412) may be fabricated from a different material than the outer layers 406, 408. In one exemplary embodiment, the outer layers 406, 408, and the second layer 412 may be fabricated from an iron-nickel alloy and the first and third layers 410, 414 may be fabricated from copper or a metal foam (such as an aluminum foam).

The layers of the multilayer composite that may form the multilayer support structure 206 may be bonded together in any suitable manner sufficiently strong enough to bond the layers in order to achieve the desired properties of the support structure 206 as discussed above. Non limiting examples of suitable bonding techniques include brazing, soldering, welding, cladding, roll forming, attaching via adhesive, or any other suitable manner in which to form a strong bond between the layers.

Figure 5:
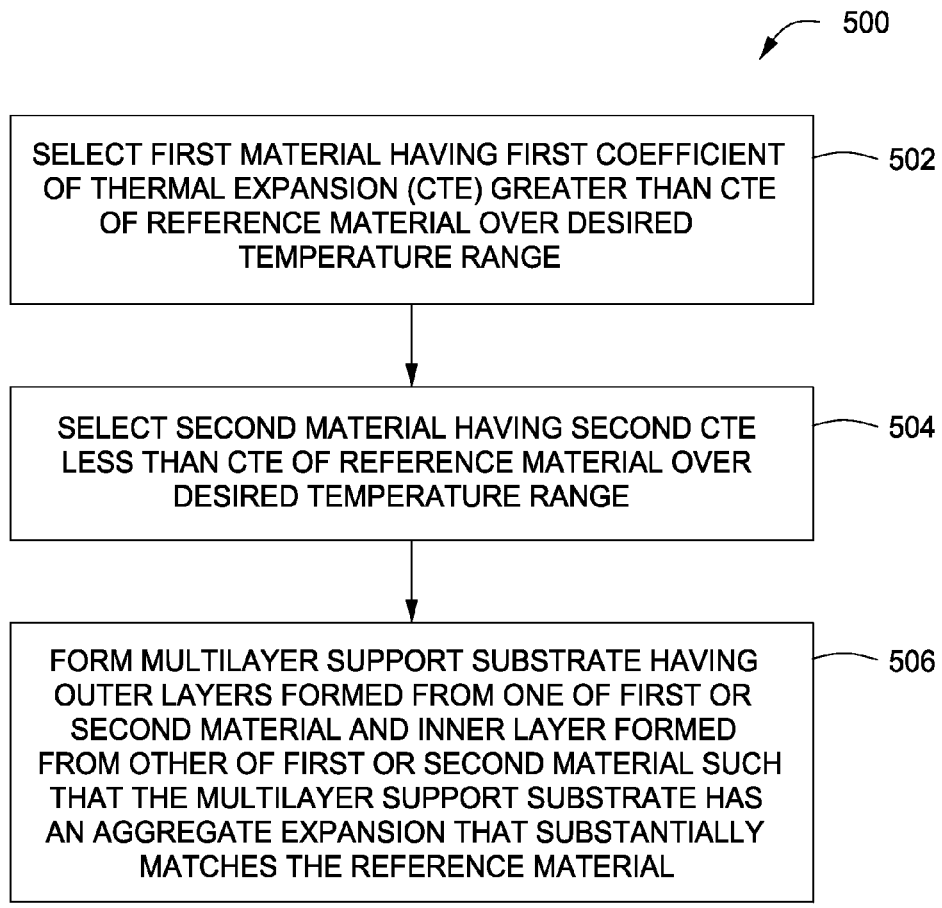
FIG. 5 depicts a flow chart for a method of designing a multilayer support structure according to some embodiments of the invention.

A flow chart of a method 500 for designing a multilayer support substrate for use in a probe card is depicted in FIG. 5. The method 500 is described below with respect to the multilayer support substrate 206 depicted in FIGS. 4A-B. The method 500 begins at 502 where a first material is selected having a first CTE that is greater than or less than the CTE of a reference material over a desired temperature range. The first material can be any of the materials discussed above. The reference material may be, for example, silicon or any other suitable DUT material. The desired temperature range may be between about −50 to about 150 degrees Celsius as discussed above. In some embodiments, the desired temperature range may consist of a desired temperature rather than a range. At 504, a second material is selected having a second CTE that is complementary to the CTE of the first material over the desired temperature range with respect to achieving the desired target thermal expansion behavior. The second material may also be chosen to improve the properties of the composite with respect to the properties of the first material. The second material can be any of the materials discussed above.

Next, at 506, a multilayer support substrate, such as the multilayer support substrate 206, may be formed having at least a layer of the first material and at least a layer of the second material combined such that the multilayer support substrate has a desired CTE as a function of temperature over a desired temperature range such that the thermal expansion of the support substrate substantially matches the thermal strain of the reference material. For example, a multilayer support substrate may be fabricated having two outer layers formed from one of the first or the second material and an inner layer formed from the other of the first or the second material such that the multilayer support substrate has a desired CTE as a function of temperature over the desired temperature range such that the thermal expansion of the support substrate substantially matches that of the reference material. The material selection and the thickness of the various layers may be facilitated, for example, by utilizing Formula (1), discussed above. The first material can be utilized as one of the inner layer 404 or the outer layers 406, 408 in the multilayer composite 400 and the second material can be utilized for the other of the inner layer 404 or the outer layers 406, 408. In some embodiments, layers of the first and second material may be alternated to form a multilayer structure having additional layers, such as shown in the multilayer composite 407 of FIG. 4B.

A thickness of each layer formed from the first and/or second materials may be selected such that the multilayer composite formed has a thermal strain substantially matching the thermal strain of the reference material over a desired temperature range. For example, after determining the overall thicknesses required of the different materials required to obtain the desired aggregate thermal expansion of the multilayer support substrate, the thickness of one of the materials may be divided in half to provide the two outer layers, and the other material may be utilized as the inner layer. Alternatively, the thicknesses each of the materials may be divided as required to provide the requisite number of layers to form a multilayer support substrate having more than three layers (e.g., such as shown in FIG. 4B).

Optionally, in some embodiments, a third material may be selected having a CTE that is either the same as, greater than, or less than that of the reference material over the desired temperature range. The third material may generally be any of the materials discussed above as suitable for the first or the second materials. In some embodiments, the third material may have a CTE between the first and second materials over the desired temperature range. For example, the third material can be utilized to form one or more of the layers 410, 412, 414 of the multilayer composite 407. In some embodiments, the third material may be utilized to form layers 410 and 414, where a first material is utilized to form outer layers 406 and 408 and a second material is utilized for form inner layer 412. In some embodiments, the third material may be utilized to form layer 412, where a first material is utilized to form outer layers 406 and 408 and a second material is utilized for form inner layers 410, 414.

Figure 6:
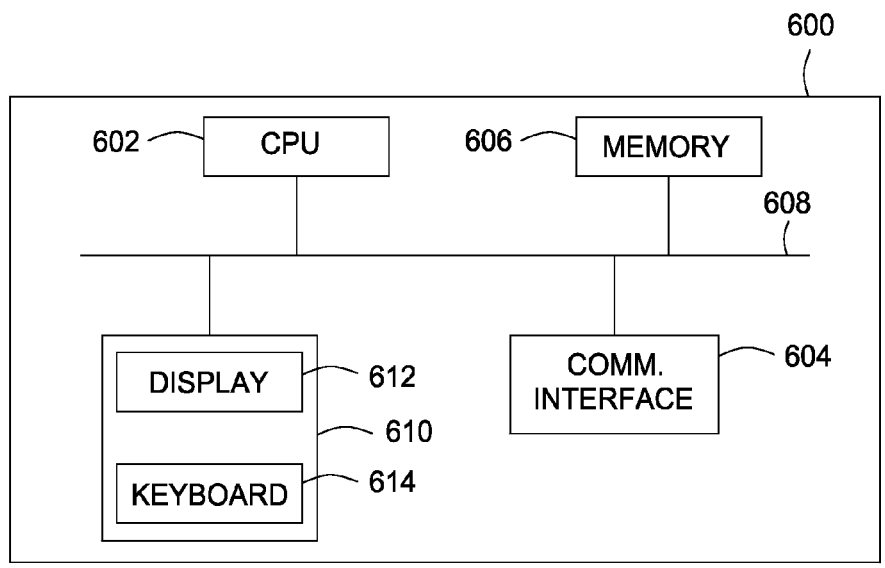
FIG. 6 depicts a schematic diagram of a computer system that may be utilized for designing a multilayer support structure in accordance with some embodiments of the invention.

In some embodiments, methods for designing a multilayer support substrate as described above in relation to FIG. 5 can be implemented on a computer. For example, FIG. 6 depicts an embodiment of a computer 600 suitable for use in accordance with the teachings described herein. The computer 600 may include one or more central processing units (CPU's) 602, one or more communications interfaces 604, a memory 606, and one or more communication buses 608 to interconnect these components. The computer 600 may also include a user interface 610, for example having a display 612 (e.g., to provide a visual display for a user) and/or a keyboard 614 (e.g., to enter commands or other data). The memory 606 may include random access memory (RAM) and may also include non-volatile memory, such as magnetic or optical storage disks. The memory 606 may further include storage that is remotely located from the CPU 602. The memory 606 may store an operating system and other instructions and/or modules adapted to perform the functions discussed herein, such as embodiments of the method 500 discussed above.

Thus, embodiments of probe card assemblies and methods of design and fabrication have been disclosed herein. In some embodiments, the probe card assemblies include a multilayer support substrate engineered to have a coefficient of thermal expansion such that the thermal expansion of the multilayer support substrate substantially matches that of a reference material over a range of temperatures of the reference material. In some embodiments, the multilayer support substrate may provide a significant weight reduction (as compared to monolithic metal support substrates) which can lead to reduced soak times. In some embodiments, the multilayer support substrate may provide improved thermal conductivity (as compared to support substrates fabricated from monolithic low-expansion alloys) which can also lead to reduced soak times.

While the foregoing is directed to embodiments of the present invention, other and further embodiments of the invention may be devised without departing from the basic scope thereof, and the scope thereof is determined by the claims that follow.

The invention claimed is:

1. A probe card, comprising:
   a multilayer support substrate engineered to substantially match thermal expansion of a reference material over a desired temperature range, the multilayer support substrate including at least two layers, each of the at least two layers having a coefficient of thermal expansion (CTE) different from the CTE of the reference material; and
   a probe substrate coupled to the multilayer support substrate.

2. The probe card of claim 1, wherein the reference material is silicon.

3. The probe card of claim 1, wherein the multilayer support substrate further comprises:
   two outer layers formed of a first material having a first CTE over the desired temperature range, wherein one of the two outer layers is one of the at least two layers; and
   an inner layer disposed between the two outer layers and formed of a second material having a second CTE different than the first over the desired temperature range, wherein the inner layer is another one of the at least two layers.

4. The probe card of claim 3, wherein, over the desired temperature range, one of the first or the second coefficients of thermal expansion is greater than the CTE of the reference material over the desired temperature range and the other of the first or the second CTE is less than the CTE of the reference material over the desired temperature range.

5. The probe card of claim 3, wherein the first material comprises an iron-nickel alloy.

6. The probe card of claim 3, wherein the second material comprises copper.

7. The probe card of claim 3, wherein the second material comprises a metal foam.

8. The probe card of claim 3, further comprising a plurality of inner layers disposed between the two outer layers.

9. The probe card of claim 1, wherein a thermal conductivity of the multilayer support substrate is greater than about 10 W/mK.

10. The probe card of claim 1, wherein the desired temperature range is between about −50 to about 150 degrees Celsius.

11. The probe card of claim 1, wherein the multilayer support substrate is further engineered to substantially match thermal expansion of the reference material over the desired temperature range when the multilayer support substrate has a temperature that is offset from a temperature of the reference material over the desired temperature range.

12. The probe card of claim 1, further comprising:
   a stiffener; and
   a wiring substrate disposed between the multilayer support substrate and the stiffener, wherein the wiring substrate is constrained, by the stiffener and the multilayer support substrate, from movement in a direction normal to surfaces of the wiring substrate facing the stiffener and the multilayer support substrate, and wherein the wiring substrate may move in a direction parallel to surfaces of the wiring substrate facing the stiffener and the multilayer support substrate.

13. A probe card, comprising:
   a wiring substrate having a first side and an opposing second side;
   a stiffener disposed on the first of the wiring substrate;
   a multilayer support substrate disposed on the second side of the wiring substrate, the multilayer support substrate engineered to substantially match thermal expansion of a reference material over a desired temperature range;
   a plurality of probe substrates coupled to the multilayer support substrate on a side opposing the wiring substrate; and
   a plurality of probes extending from each probe substrate generally away from the wiring substrate, each probe being electrically connected to the wiring substrate and configured to contact terminals of a device to be tested;
   where the multilayer support substrate further comprises
      a first outer layer formed of a first material having a first coefficient of thermal expansion (CTE) over the desired temperature range, wherein the first outer layer is one of at least two layers;
      a second outer layer formed of a second material having a second CTE over the desired temperature range; and
      an inner layer disposed between the two outer layers and formed of a third material having a third CTE different than the first over the desired temperature range, wherein the inner layer is one of the at least two layers.

14. A method of designing a multilayer support substrate for use in a probe card, comprising:
   selecting a first material having a first coefficient of thermal expansion (CTE) over a desired temperature range that is greater than a CTE of a reference material over the desired temperature range;
   selecting a second material having a second CTE over the desired temperature range that is less than the CTE of the reference material over the desired temperature range; and
   forming a multilayer support substrate having two outer layers formed from one of the first or the second material and an inner layer formed from the other of the first or the second material such that the multilayer support substrate has an aggregate thermal expansion behavior over the desired temperature range that substantially matches that of the reference material.

15. The method of claim 14, wherein the reference material is silicon.

16. The method of claim 14, wherein the desired temperature range is between about −50 to about 150 degrees Celsius.

17. The method of claim 14, wherein the first material is an alloy comprising iron and nickel.

18. The method of claim 14, wherein second material comprises copper.

19. The method of claim 14, wherein the second material comprises an aluminum foam.

20. The method of claim 14, wherein forming the multilayer support substrate further comprises:
   selecting a third material having a third CTE; and forming one or more additional inner layers of the multilayer support substrate from the third material.

21. The method of claim 14, wherein the aggregate thermal expansion behavior of the multilayer support substrate over the desired temperature range substantially matches that of the reference material when the multilayer support substrate has a temperature that is offset from a temperature of the reference material.

* * * * *